United States Patent [19]

Dowben

[11] Patent Number: 5,658,834
[45] Date of Patent: Aug. 19, 1997

[54] FORMING $B_{1-x}C_x$ SEMICONDUCTOR LAYERS BY CHEMICAL VAPOR DEPOSITION

[75] Inventor: Peter A. Dowben, Dewitt, N.Y.

[73] Assignee: Syracuse University, Syracuse, N.Y.

[21] Appl. No.: 560,298

[22] Filed: Nov. 17, 1995

Related U.S. Application Data

[62] Division of Ser. No. 87,975, Jul. 7, 1993, Pat. No. 5,468,978.
[51] Int. Cl.[6] .................................... H01L 21/02
[52] U.S. Cl. .................. 438/478; 257/77; 148/33.3; 148/33.4; 117/103; 117/951
[58] Field of Search .................. 257/77; 437/236, 437/235; 148/33.3, 33.4

[56] References Cited

U.S. PATENT DOCUMENTS

| | | | |
|---|---|---|---|
| 4,957,773 | 9/1990 | Spencer et al. | 427/255.1 |
| 4,980,198 | 12/1990 | Dowben et al. | 427/255.3 |
| 5,164,805 | 11/1992 | Lee | 257/351 |

FOREIGN PATENT DOCUMENTS 60-152069  8/1985  Japan.

*Primary Examiner*—Charles L. Bowers, Jr.
*Assistant Examiner*—Ramamohan Rao Paladugu
*Attorney, Agent, or Firm*—Harris Beach & Wilcox, LLP

[57] ABSTRACT

Active semiconductor devices including heterojunction diodes and thin film transistors are formed by PECVD deposition of a boron carbide thin film on an N-type substrate. The boron to carbon ratio of the deposited material is controlled so that the film has a suitable band gap energy. Boron carbides such as $B_{4.7}C$, $B_{7.2}C$ and $B_{19}C$ have suitable band gap energies between 0.8 and 1.7 eV. The stoichiometry of the film can be selected by varying the partial pressure of precursor gases, such as nido pentaborane and methane. The precursor gas or gases are energized, e.g., in a plasma reactor. The heterojunction diodes retain good rectifying properties at elevated temperature, e.g., up to 400° C.

7 Claims, 6 Drawing Sheets

FORMING $B_{1-x}C_x$ SEMICONDUCTOR LAYERS BY CHEMICAL VAPOR DEPOSITION

This is a divisional of application Ser. No. 08/087,975 filed on Jul. 7, 1993, now U.S. Pat. No. 5,468,978.

This invention resulted in part from research conducted under NSF grant DDM 92-22880 and US Air Force grant AFOSR F49-620-92J053. The government has certain rights in the invention.

BACKGROUND OF THE INVENTION

This invention relates to the process of deposition of boron carbide semiconductor material, and also to semiconductor devices formed by deposition of a boron carbide film. The invention is more particularly directed to a technique for creating a layer of boron carbide with a boron-to-carbon ratio selected to achieve a suitable semiconductor energy band gap. The invention is also particularly directed to heterojunction semiconductor devices produced by this technique.

Techniques are known for forming boron-rich carbides. These techniques can employ alkanes and heavy boron cage molecules to deposit boron carbide thin films. Plasma-enhanced chemical vapor deposition (PECVD) can be employed to fabricate boron carbide films without resort to high temperatures or high pressures. These technique typically employ a halide of boron, e.g. $BCl_3$, $BBr_3$ or $BI_3$. Most recently boranes, such as nido-decaborane and nido-pentaborane have gained interest, because these compounds are safe and stable, yet produce a vapor pressure of several Torr at room temperature. However, until very recently, only low-resistivity boron carbide materials could be produced, i.e., materials with resistivities on the order of about ten ohm-cm at room temperature. Boron carbide material of this type has an extremely low band gap, and is not suited as a semiconductor material.

At the same time, boron carbide has become an attractive material because of its inherent hardness and durability. Boron carbide, like other boron-containing materials, has been considered for high temperature electronic devices because it retains its useful characteristics at elevated temperatures. For example, boron carbide is know to have a melting temperature of 2350° C., a strength of 50 ksi, a hardness of 2800 $kg/mm^2$, and a thermal conductivity of 0.22 cal/cm/sec/° C./cm. Diamond and silicon carbide have been investigated because of their good thermal and mechanical characteristics, and because of their wide band gaps. However, these materials have not yet proven cost effective.

OBJECTS AND SUMMARY OF THE INVENTION

It is an object of this invention to provide cost-effective boron-carbide based semiconductor devices and techniques to fabricate same.

It is another object to provide a semiconductor device suited for use in high temperatures or other harsh environmental conditions.

According to an aspect of this invention, a heterojunction semiconductor device, e.g., a diode or a thin film transistor, can be fabricated by deposition of a thin film of boron carbide onto a substrate of a semiconductor material, such as N-type [1,1,1] silicon, silicon carbide, or another suitable material. The boron carbide has its boron-carbon ratio selected so as to achieve a suitable semiconductor band gap on the order of 0.7 to 1.8 eV. This boron carbide layer is P-type material, without requiring doping. The boron to carbon ratio is between 2.4 and 50, so that the boron carbide film has a resistivity in the range of $10^4$ to $10^{10}$ ohm-centimeters.

In one technique, a precursor vapor such as carborane is introduced into the chamber in which the substrate is located. Then the boron and carbon atoms are dissociated by radiation, e.g. by X-ray lithography or laser writing. The boron and carbon re-associate as the boron carbide semiconductor film at selected locations on the substrate on which the radiation was incident. In an alternative technique, a vapor mixture of nido pentaborane and methane or another alkane is introduced into a PECVD reactor that holds the substrate. The vapors are energized by radio frequency energy applied to the reactor. This dissociates the carbon and boron atoms which reform as the boron carbide film on the substrate. A suitable plasma chamber in which this technique can be carried out is shown and described in U.S. Pat. No. 4,957,773.

The above and many other objects, features, and advantages of this invention will become apparent from the ensuing description of a preferred embodiment, to be read in conjunction with the accompanying Drawing.

DETAILED DESCRIPTION OF THE PREFERRED EMBODIMENT

Boron carbide films with thickness ranging from 1 μm to 0.1 μm were grown on n-type Si[1,1,1] doped to $7 \times 10^{14}/cm^3$. The composition of the boron carbide film was controlled by adjusting the partial pressure ratio of nido-pentaborane ($B_5H_9$) and methane ($CH_4$). The film deposition was undertaken at about 400° C. in a custom designed parallel plate 13.56 MHz radio-frequency PECVD reactor described previously in U.S. Pat. No. 4,957,773. The composition and thickness of thin films were determined by Auger electron spectroscopy and using a profilometer. Three boron carbide compositions were chosen and have been well characterized. These compositions $B_{4.7}C, B_{7.2}C$ and $B_{19}C$, have band gaps that are experimentally determined to be 0.8, 0.9 and 1.2 eV, respectively, using optical absorption spectroscopy. To characterize the properties of the mesa type diodes, I–V characteristic curves were obtained. Co-planar chromium electrodes were deposited on boron carbide films by thermal evaporation for high temperature studies. I–V characteristics of the heterojunction devices were evaluated from room temperature to temperatures well over 400° C.

Figure 1:
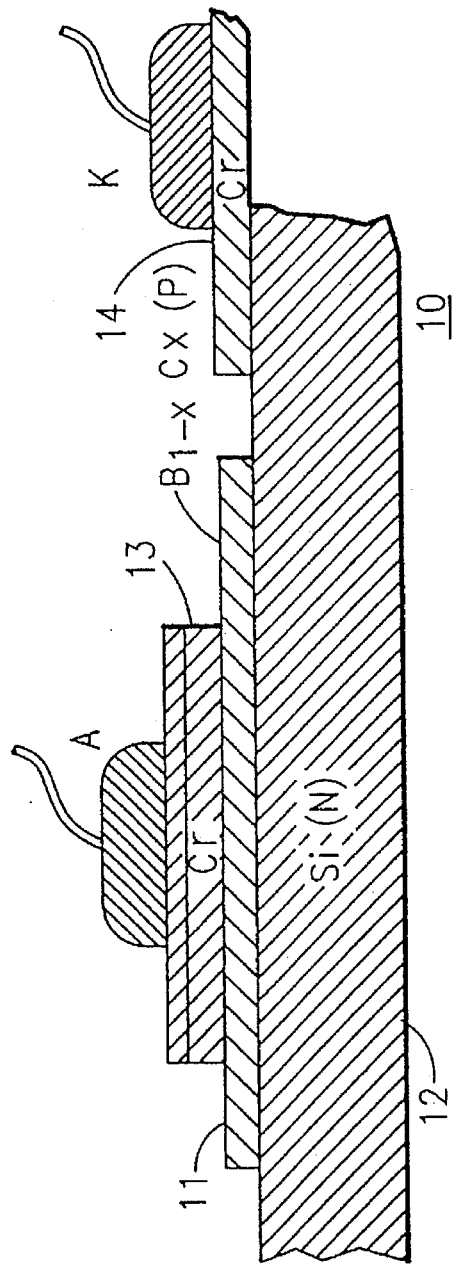
FIG. 1 is a schematic cross section of a diode according to an embodiment of this invention.

PN heterojunction diodes, as shown in FIG. 1, were formed by depositing boron carbide thin films on N-type Si

[1,1,1] substrates. The deposited boron carbide films are available over a wide range of stoichiometries, i.e., $B_{1-x}C_x$, where $0.02 \leq X \leq 0.29$. Compositional uniformity was achieved. The composition was selected by controlling the relative partial pressures of $B_5H_9$ and $CH_4$ supplied to the PECVD reactor. These boron carbide materials have resistivities on the order of $10^4$ to $10^{10}$ ohm centimeters. The boron to carbon ratio is on the order of 2.4 to 50. The chromium electrodes were deposited in contact with the p-type boron carbide film and with the η-type substrates, respectively serving as anode and cathode electrodes.

FIG. 1 shows a general diode structure 10, with a boron carbide film 11 deposited in contact with the silicon substrate 12, and with respective chromium metallizations 13,14 serving as anode A and cathode K. As described below the stoichiometry of the film 11 determines its band gap characteristics, so that the heterojunction diode can be designed for a specific function or environment.

Figure 2:
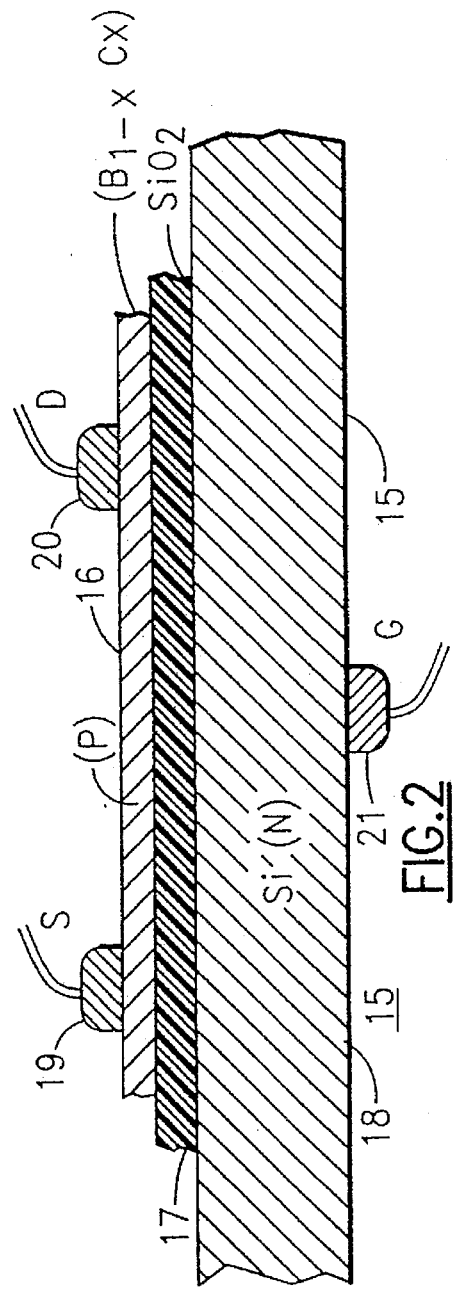
FIG. 2 is a schematic cross section of a heterojunction thin film transistor according to an embodiment of this invention.

FIG. 2 shows the general structure of another device, in this case a thin film transistor 15. A thin film boron carbide layer 16 is deposited atop an insulating layer 17 on a silicon substrate 18. In this case the layer 17 is silicon oxide, but other insulating layers such as a deposited BN layer could be used if desired.

Source and drain electrodes 19 and 20 are formed on the P-type boron carbide film layer 16, and a gate electrode 21 is in contact with the substrate 18. In this case the thin film 16 serves as a P-type channel.

As we shall see shortly, devices of these type have good high temperature characteristics, and are stable in many harsh environments, making the heterojunction devices especially rugged and thus attractive for many applications.

Boron carbide deposited on n-type silicon doped to moderate doping level ($7 \times 10^{14}/cm^3$ or smaller) makes an excellent PN heterojunction diode as seen in FIGS. 3A to 3D.

Figure 3A:
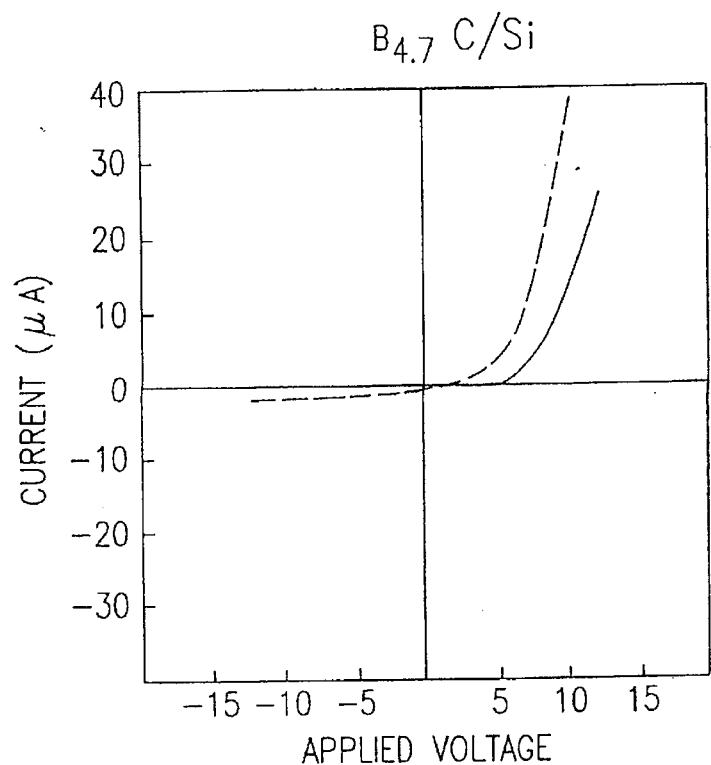
FIGS. 3A, 3B, 3C and 3D are voltage-current characteristics of heterojunction diodes of this invention.
Figure 3B:
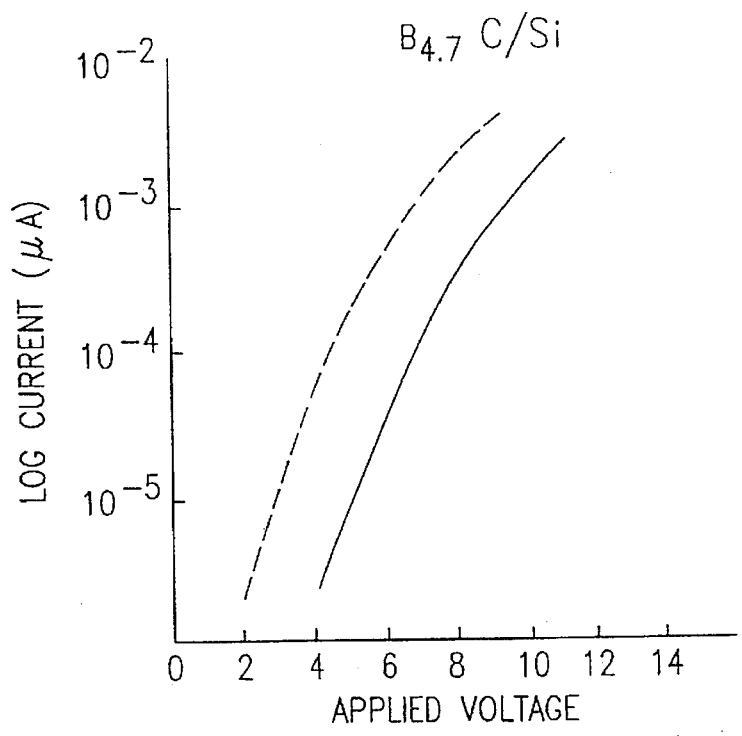

FIG. 3A shows the current versus applied voltage characteristic for the $B_{4.7}$ C/Si diode while FIG. 3B shows logarithmically the behavior of current relative to applied voltage for the same diode.

Figure 3C:
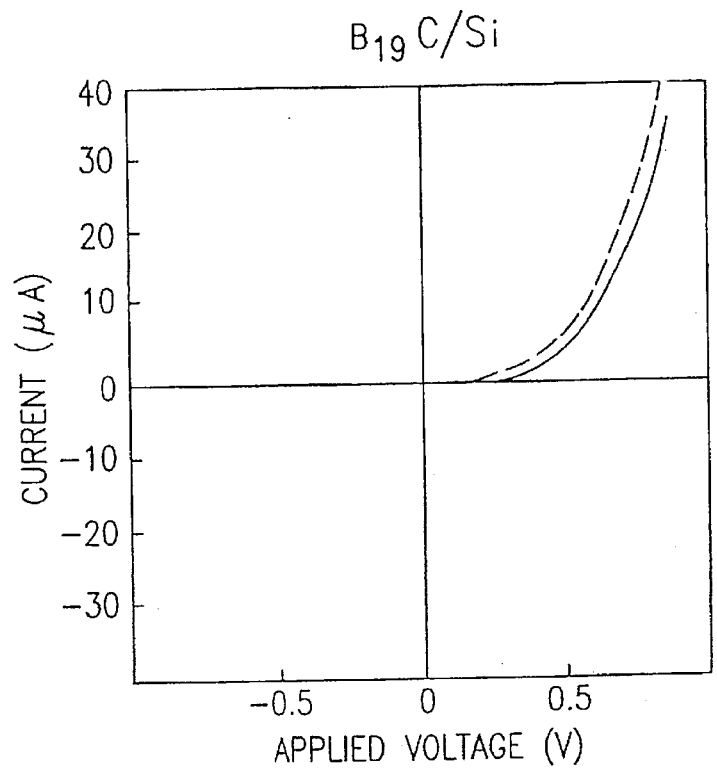
Figure 3D:
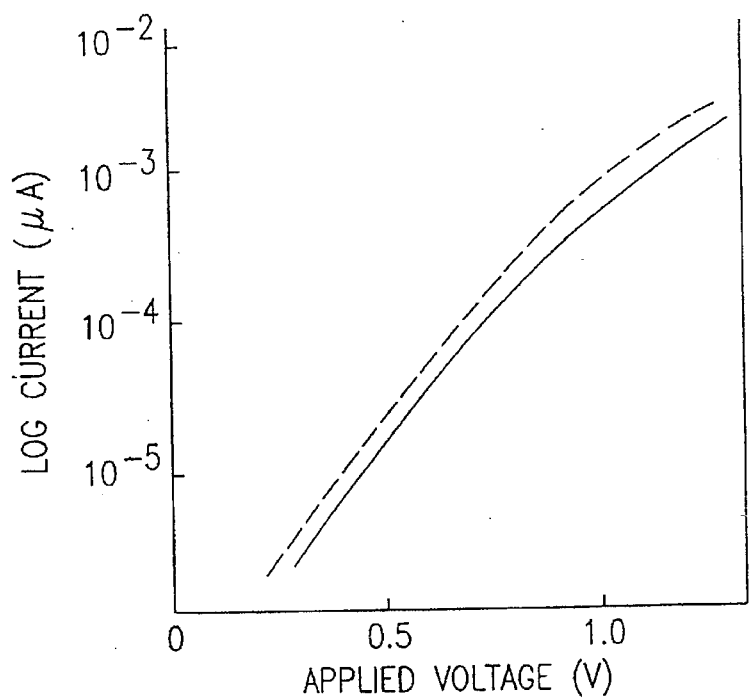

FIGS. 3C and 3D plot similar relationships for the diode formed of $B_{19}$ C/Si materials. In each case the dash line shows the behavior under the influence of visible light wavelengths, while the solid line shows the dark characteristics.

As shown in FIGS. 3B and 3D, the current versus voltage characteristics for both $B_{4.7}C$ and $B_{19}C$ are stable and lack an expontial increase. This behavior is due to high resistivity of the boron carbide films, which is order of $10^9$ $\Omega cm$ at room temperature. Diodes fabricated out of diamond also show similar characteristics of high resistivity materials. Unlike the pure boron carbide material, the boron carbide/silicon heterojunction is seen to be strongly photoactive. Visible light enhances the current in both the forward and reverse bias directions, but the effect of light is most pronounced in the forward direction, as seen in FIGS. 3A and 3C. This is consistent with formation of a space charge bilayer at the boron carbide/silicon interface.

Figure 5:
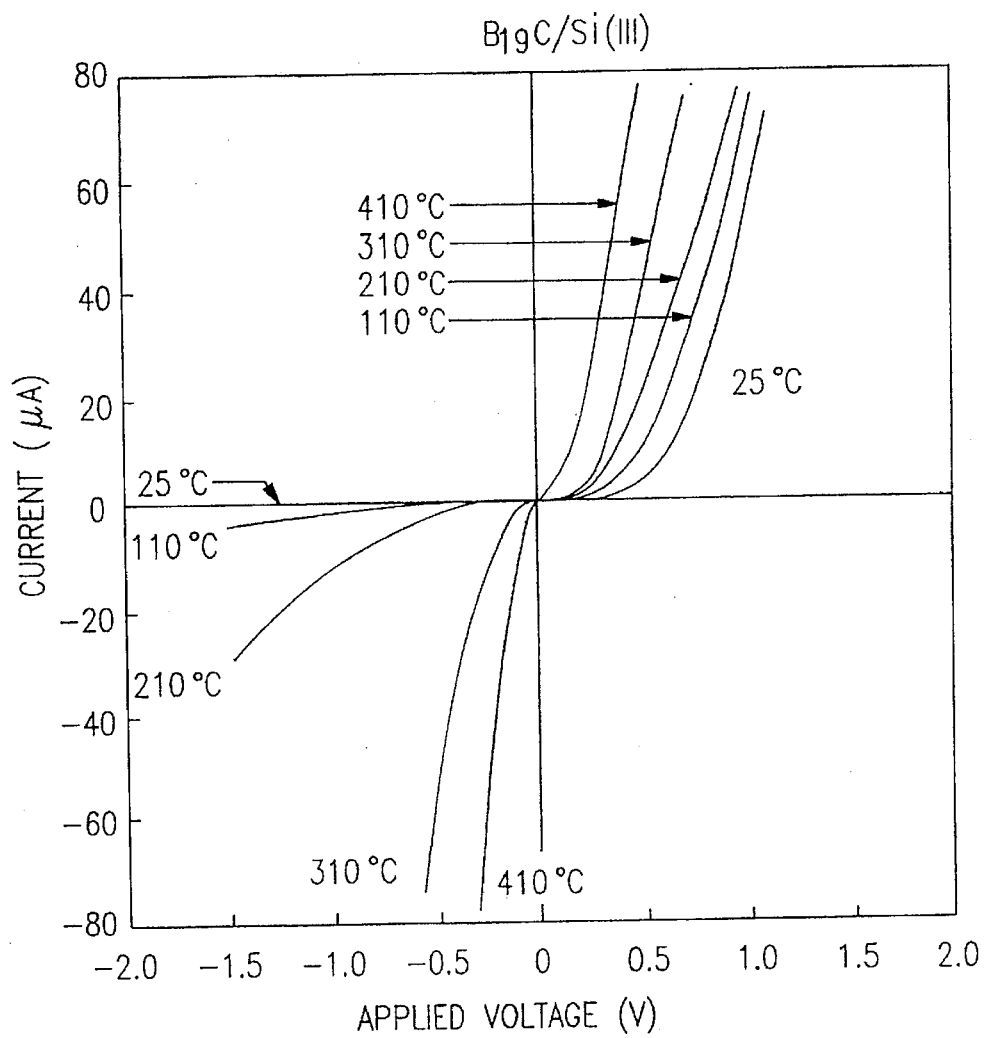
FIGS. 5 and 6 show the variation of current-voltage characteristics with temperature for heterojunction transistors according to this invention.

FIG. 5 shows the temperature variability of current-voltage characteristic of the $B_{19}C/Si$ heterojunction diode temperature range from 25° C. to over 400° C. The diode onset voltages for forward bias are reduced as temperature is increased. The current-voltage characteristic for the $B_{7.2}C/Si$ heterojunction diode is more temperature sensitive than is the case for the $B_{19}C/Si$ heterojunction diode. The difference of 300 meV in band gap between the two boron carbides explains the greater temperature sensitivity of the heterojunction made with the smaller-band-gap boron carbides.

The heterojunction boron carbide/silicon diodes exhibit good current-voltage characteristics even at temperatures well above 200° C., particularly with the large-band-gap boron carbides. This type of heterojunction diode is similar to silicon carbide/silicon heterojunction diodes. The behavior of boron carbide/silicon heterojunctions with temperature compares well with not only SiC/Si heterojunction but also with diamond-based homojunction and Schottky diodes. The reduced series resistance of the diodes with increased temperature, observed with boron carbide/silicon heterojunction diodes, is similar to that observed in diamond-based diodes. The reduced resistance with increasing temperature is explained by the increased mobility and carrier concentration in both materials. The activation energy of the series resistance for diamond-based diodes is much smaller than the activation energies observed for boron carbide/silicon heterojunction diodes. The activation energy and conductances for diamond based diodes can be almost metallic in value depending upon the doping level and quality of the PN junction. This results from many causes including the penetration depth of the dopants and the doping concentration, Similar shortcomings occur also in silicon carbide based devices. These kinds of problems can be completely eliminated with boron carbide based devices because boron carbides do not require doping yet have low carrier concentrations. Furthermore, it is relatively easy to deposit boron carbide on N-type substrates of a sufficient quality to form a PN junction.

Figure 4A:
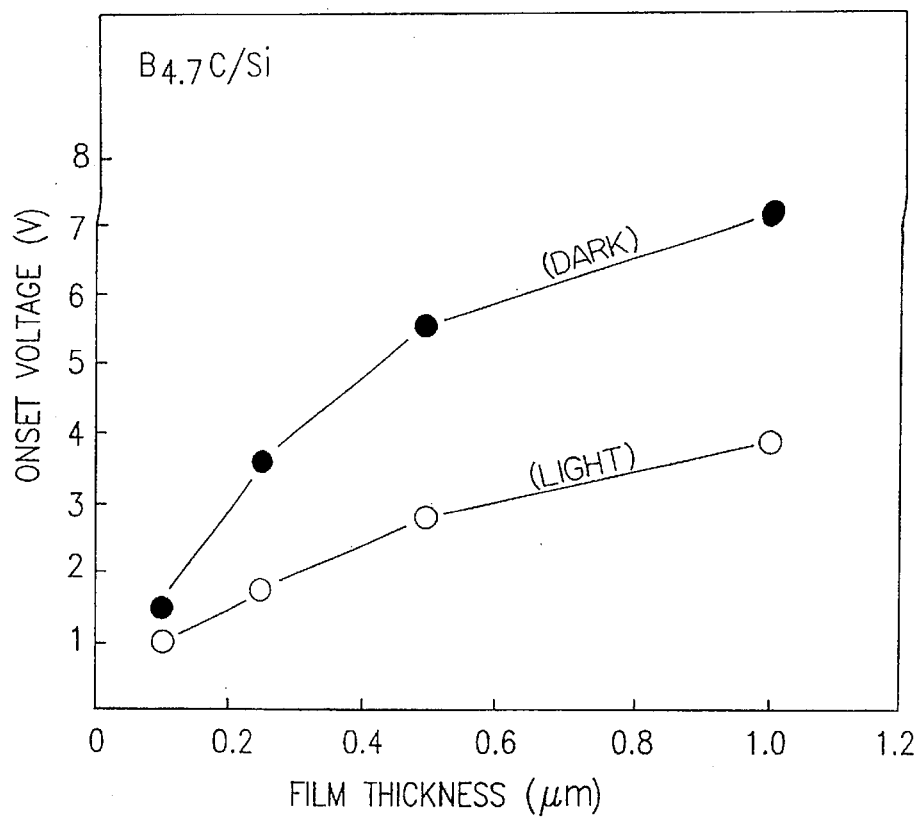
FIGS. 4A and 4B are curves of the relationship of forward bias threshold or onset voltage to film thickness for heterojunction diodes of this invention.
Figure 4B:
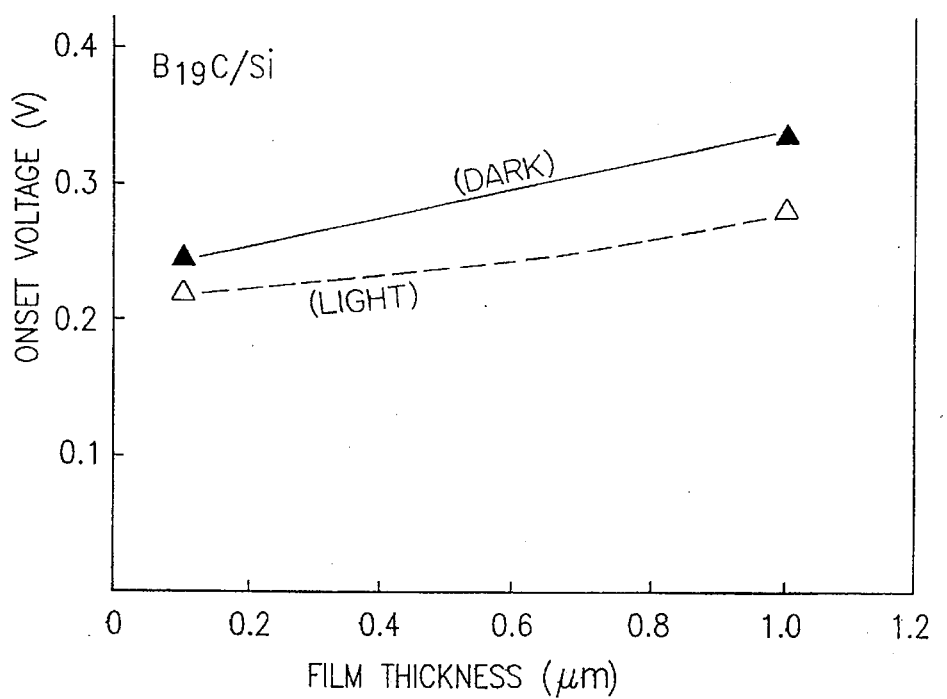

FIGS. 4A and 4B respectively show the threshold or onset voltage for forward-biased current flow for mesa geometry PN $B_{4.7}C/Si$ and $B_{19}C/Si$ heterojunction diodes, as a function of film thickness. The effect of photosensitivity is seen by comparing the irradiated-device curves (open circle and open triangle) with the dark-device curves (black circle and black triangle).

The threshold of forward current flow in the analog I–V plot as a figure of merit is seen in FIGS. 4A and 4B to vary as a function of increasing boron carbide film thickness of both $B_{4.7}C$ and $B_{19}C$. Film thickness has a dramatic effect on I–V characteristic for the $B_{4.7}C/Si$ heterojunction. The distribution charge in the space charge bilayer explains the variability of the onset voltage of the diodes. The distribution of charge can be adjusted by a change in the depletion width, as is clear from these plots of different film thickness boron carbides on Si[1,1,1]. From the thickness dependence, it is clear that the space charge bilayer width for $B_{4.7}C/Si$ is much larger than space charge width for $B_{19}C/Si$. Enhancement of current by light is different between low- and high-carbon concentration diodes. The analog diode onset voltage for $B_{4.7}C/Si$ is much larger than that for $B_{19}C/Si$; on the other hand, the photocurrent relative to the dark current for the high carbon content diode is greater than that for the low carbon content diode as shown in FIGS. 3A and 3C.

FIG. 5 shows the current-voltage characteristics of a $B_{19}C/Si$ PN heterojunction diode for a temperature range of 25° C. to 410° C. This diode shows excellent rectifying properties and is comparable to diodes fabricated from diamond or silicon carbide.

As also shown in FIG. 5, the reverse current characteristic is also sensitive to changes in temperature. Reverse current in the $B_{19}C/Si$ heterojunction the diode increase greatly with increasing temperature. Both diode breakdown voltage and the level of leakage current increases with increasing temperature. The leakage current at high temperatures is explained by the reduction in resistance of the boron carbide layer and/or by the extent of the band gap offset. For a number of heterojunction diodes examined, the reverse current exhibits a temperature dependence with an activation barrier that is exactly one-half of the boron carbide band gap. This is actually smaller than the 1.2 eV activation barrier for thermal conductivity observed over a wide composition range for PECVD boron carbide.

Figure 6:
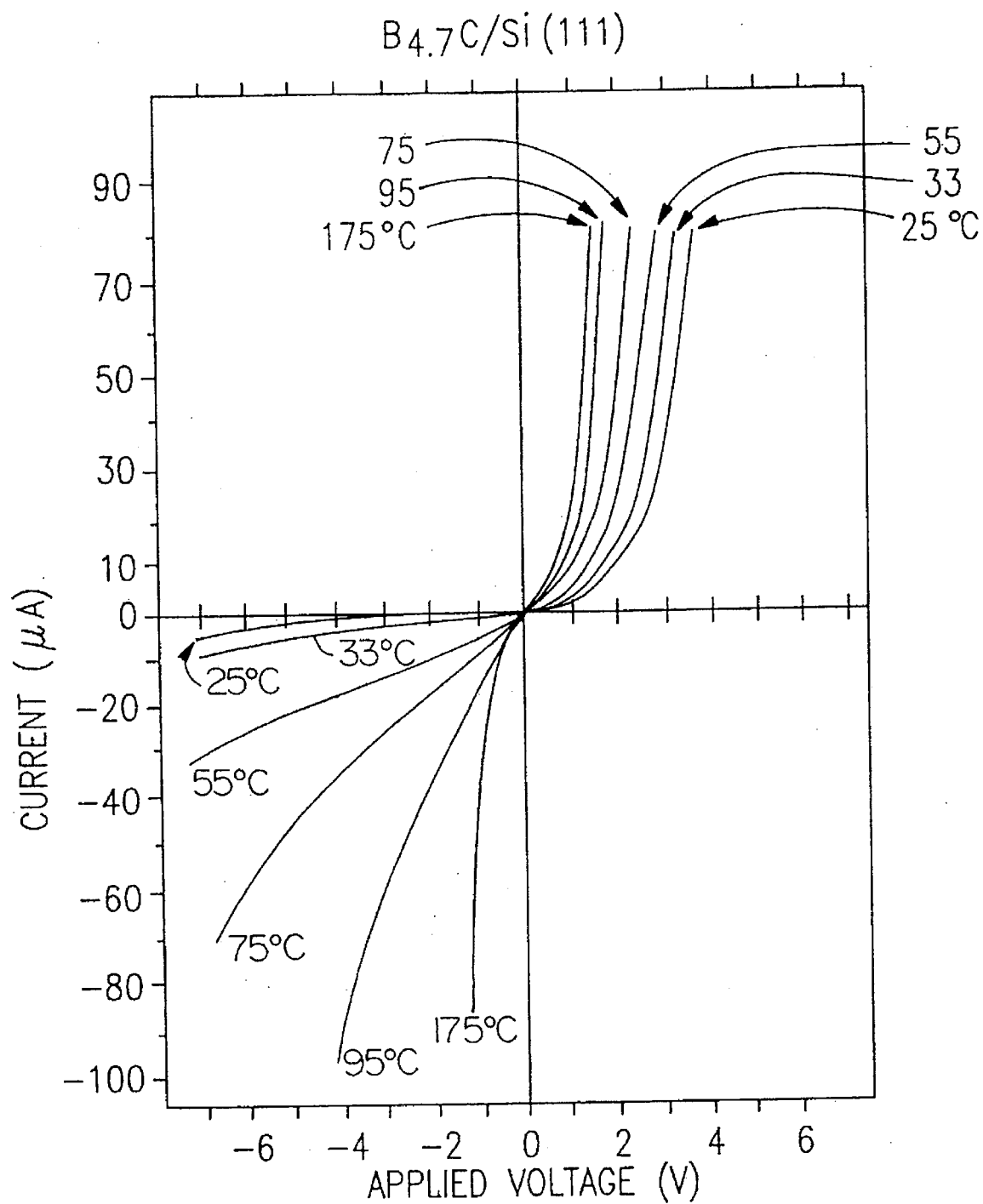

FIG. 6 shows the current-voltage characteristic of a $B_{4.7}C/Si$ PN heterojunction diode for a temperature range from about 25° C. to 175° C. This diode shows a much sharper change of reverse characteristics with temperature than does the $B_{19}C/Si$ device explained with FIG. 5. In this case the carrier concentration increases smoothly with increases in temperature. The reverse biased $B_{4.7}C/Si$ diode makes an excellent temperature sensor for the temperature range in question.

Because of lattice matching and thermal expansion concerns, substrates other than Si[1,1,1] can be attractive for fabricating heterojunction devices. One of the most important requirements for the epitaxial growth is to minimize lattice parameter mismatch between an epilayer and a substrate. Boron carbide films grown on Si[1,1,1] by PECVD tend to be microcrystalline. A thermal expansion coefficient is another consideration, especially where high-temperature processes are involved, and where the products are high-temperature devices to be employed in high temperature environments. The coefficient of thermal expansion for the substrate should be similar to that for boron carbide. The thermal expansion coefficient of boron carbide has been determined to be $5.5 \times 10^{-6}/°$ C., while for silicon it is $2.6 \times 10^{-6}/°$ C. The thermal expansion coefficient GaAs $5.9 \times 10^{-6}/°$ C. and for β-silicon carbide, $4.7 \times 10^{-6}/°$ C. GaAs or silicon carbide are attractive, as both have a thermal expansion coefficient within about 15% of that of the boron carbide film. Silicon carbide is a wide band gap material and has excellent thermal stability. Thus, silicon carbide makes a good substrate match for boron carbides used for high temperature heterojunction diodes.

Figure 7:
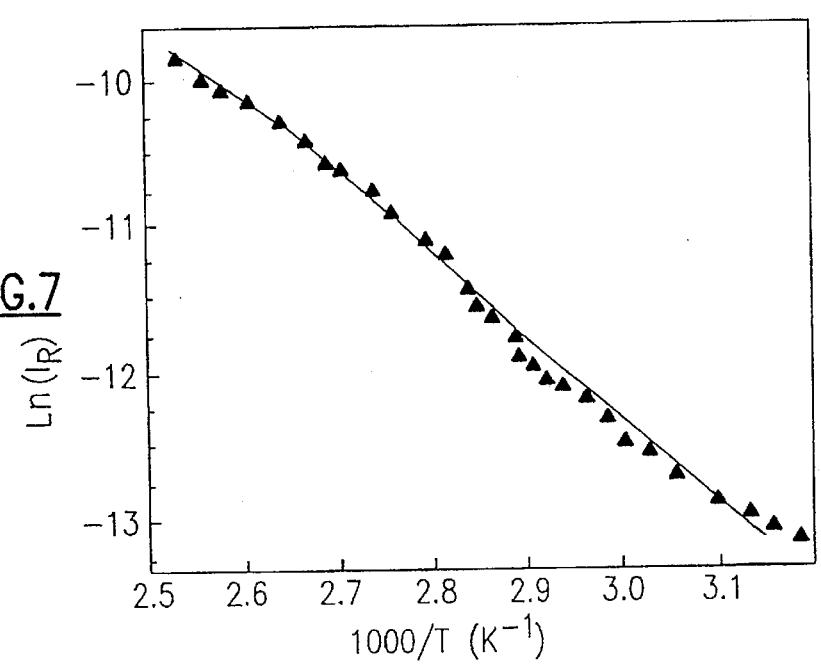
FIG. 7 is a curve showing the relation of reverse current to inverse temperature for heterojunction diodes of this invention.

FIG. 7 shows a logarithmic plot of reverse current of the $B_{7.2}C/Si$ heterojunction diode as a function of temperature. As is apparent here, the logarithm of reverse current varies almost linearly with inverse temperature. Thus, reverse current increases smoothly and exponentially with increasing temperature.

In the fabrication technique described above the gaseous mixture introduced into the PECVD chamber can include another alkane instead of methane. Also an inert gas and/or hydrogen can also be included in the mixture.

A technique for forming the boron carbide film in specific patterns on the substrate can involve irradiation with an X-ray lithography technique, electron beam or laser writing. Here a suitable precursor such as carborane is introduced into a chamber that contains the substrate. Laser energy, e.g. at a wavelength of 300 nm, impinges at specific locations on the substrate. The laser energy dissociates the carbon and boron from the carborane, which combine on the substrate to form the boron carbide film. The carborane can be 1,2 $C_2B_{10}H_2$; 1,12 $C_2B_{10}H_2$ or 1,7 $C_2B_{10}H_2$. That is, the precursor can be closo 1,2 orthocarborane, closo 1,7 metacarborane, or closo 1,12 paracarborane. This compound is attractive because it is nontoxic and stable, has a suitable vapor pressure at room temperature, and produces the boron carbide film with a suitable stoichiometry.

While this invention has been described here with reference to selected preferred embodiments, it should be recognized that the invention is not limited to those embodiments. Rather, many modification and variations would present themselves to those of skill in the art without departing from the scope and spirit of the present invention as defined in the appended claims.

What is claimed is:

1. A process for forming a semiconductor device of a boron carbide layer on a suitable substrate comprising the steps of introducing into a chamber that contains said substrate a suitable precursor vapor that contains carbon and boron, and energizing said precursor vapor at least one selected location on said substrate to dissociate boron and carbon atoms from the precursor vapor which recombines to form said boron carbide film as a P-type semiconductor layer at said at least one location, such that the resulting film has a suitable band gap on the order of 0.7 eV to 1.8 eV wherein the boron carbide film has a resistivity of the order of about $10^4$ to $10^{10}$ ohm-centimeters.

2. A process according to claim 1 wherein said precursor vapor includes a carborane selected from the group that consists of closo 1,2 orthocarborane, closo 1,7 metacarborane, and closo 1, 12 paracarborane.

3. A process according to claim 1 wherein said energization is carried out by incident X-rays or electron beam.

4. A process according to claim 1 wherein said energization is carried out by laser writing.

5. A process for forming a semiconductor device of a boron carbide layer on a suitable substrate comprising introducing into a deposition chamber that contains said substrate a gaseous mixture of a nido pentaborane and an alkane, energizing the gaseous mixture in the chamber sufficiently to dissociate boron atoms and carbon atoms which then combine as said boron carbide film on the substrate, and maintaining relative partial pressures of said nido pentaborane and said alkane suitably to achieve a stoichiometry of boron and carbon in the resulting boron carbide film such that the film has a band gap on the order of 0.7 eV to 1.8 eV wherein the boron carbide film has a resistivity of the order of about $10^4$ to $10^{10}$ ohm-centimeters.

6. A process according to claim 5 wherein said deposition chamber is a plasma-enhanced chemical vapor deposition reactor, and said energization is carried out by applying RF energy to said reactor.

7. A process according to claim 5 wherein said substrate includes a layer of N-type semiconductor material on which the boron carbide layer is deposited.

* * * * *